(12) United States Patent
Jung

(10) Patent No.: US 10,234,731 B2
(45) Date of Patent: Mar. 19, 2019

(54) DISPLAY DEVICE AND MANUFACTURING METHOD THEREOF

(71) Applicant: LG Display Co., Ltd., Seoul (KR)

(72) Inventor: Hana Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/690,102

(22) Filed: Aug. 29, 2017

(65) Prior Publication Data

US 2018/0059453 A1 Mar. 1, 2018

(30) Foreign Application Priority Data

Aug. 29, 2016 (KR) .................. 10-2016-0110272

(51) Int. Cl.
*G02F 1/1343* (2006.01)
*G02F 1/1333* (2006.01)
*H01L 27/32* (2006.01)
*H01L 51/52* (2006.01)

(52) U.S. Cl.
CPC ...... *G02F 1/1343* (2013.01); *G02F 1/133345* (2013.01); *H01L 27/3213* (2013.01); *H01L 27/3262* (2013.01); *H01L 51/5203* (2013.01)

(58) Field of Classification Search
CPC ............. G02F 1/1343; G02F 1/133345; H01L 27/3213; H01L 27/3262; H01L 51/5203
USPC ................................... 349/43, 143
See application file for complete search history.

(56) References Cited

U.S. PATENT DOCUMENTS

2010/0231124 A1* 9/2010 Song ................. H01L 27/3276 313/504
2016/0336528 A1* 11/2016 Lee ..................... H01L 51/5225

\* cited by examiner

*Primary Examiner* — Edward Glick
*Assistant Examiner* — William Peterson
(74) *Attorney, Agent, or Firm* — Fenwick & West LLP

(57) ABSTRACT

A display device includes a substrate, a lower electrode, an emission layer, and an upper electrode. A transistor part is located on the substrate. The lower electrode is positioned on an insulating layer formed on the uppermost layer of the transistor part and includes a neck having a narrower width than other regions. The emission layer is positioned on the lower electrode. The upper electrode is positioned on the emission layer. The insulating layer is positioned in the neck and has a recessed pattern depressed downward.

12 Claims, 16 Drawing Sheets

DISPLAY DEVICE AND MANUFACTURING METHOD THEREOF

CROSS-REFERENCE TO RELATED APPLICATIONS

This application claims priority to Republic of Korea Patent Application No. 10-2016-0110272, filed on Aug. 29, 2016, which is incorporated herein by reference for all purposes as if fully set forth herein.

BACKGROUND

Field

The present invention relates to a display device and a manufacturing method thereof.

Description of the Related Art

With the development of information society, there is increasing demand for display devices for displaying images in various manners. Display devices have rapidly developed into light and thin large-screen display devices which have replaced the bulky cathode ray tubes (CRTs).

Display devices include liquid crystal display (LCD) devices, plasma display panels (PDPs), organic light-emitting diode (OLED) display devices, electrophoretic display (ED) devices, etc.

LCD devices, OLED display devices, and ED devices include a display panel and a driver for driving the display panel. The driver includes a scan driver for supplying a scan signal (or a gate signal) to the display panel and a data driver for supplying a data signal to the display panel. When a scan signal and a data signal are provided to sub-pixels, the display panel can display an image in such a manner that light is emitted through selected sub-pixels.

The display panel includes a substrate on which elements which operate to display images and power lines and signal lines for delivering power and signals to the elements are formed.

A procedure for manufacturing a display panel includes a deposition process and a repair process. The deposition process is a process of forming a conductive layer, a metal layer, and an insulating layer on a substrate to form structures such as elements (including electrodes), power lines and signal lines. The repair process is a process of repairing defects in the structures formed on the substrate or blackening defective sub-pixels. However, conventional methods need to be improved in order to enhance display panel production yield and increase process tact time while reducing manufacturing costs.

SUMMARY

The present disclosure provides a display device including a substrate, a lower electrode, an emission layer, and an upper electrode. A transistor part is located on the substrate. The lower electrode is positioned on an insulating layer formed on the uppermost layer of the transistor part and includes a neck having a narrower width than other regions. The emission layer is positioned on the lower electrode. The upper electrode is positioned on the emission layer. The insulating layer is positioned corresponding to the neck and has a recessed pattern depressed downward.

In another aspect, the present disclosure provides a display device including an insulating layer and a lower electrode. The insulating layer is positioned on a substrate. The lower electrode is positioned on the insulating layer and includes a neck having a narrower width than other regions. The insulating layer has a recessed pattern positioned corresponding to the neck and depressed downward.

In another aspect, the present disclosure provides a method of manufacturing a display device. The method of manufacturing a display device includes forming an insulating layer on one side of a substrate, forming a recessed pattern depressed downward in the insulating layer, and forming a lower electrode including a neck having a narrower width than other regions on the insulating layer. The recessed pattern corresponds to the neck.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DETAILED DESCRIPTION OF EMBODIMENTS

Reference will now be made in detail embodiments of the invention examples of which are illustrated in the accompanying drawings.

Embodiments of the present invention will be described with reference to the attached drawings.

A display device according to the present invention is implemented as a television, a video player, a personal computer (PC), a home theater system, a smartphone, etc. A liquid crystal display panel, an OLED display panel, an ED panel, a plasma display panel or the like can be selected as a display panel of the display device. However, the present disclosure is not limited thereto.

In the following, an OLED display device based on an OLED display panel will be exemplified for convenience of description. In addition, a display panel based on an oxide thin-film transistor (TFT) is exemplified. The oxide TFT uses part of a semiconductor layer as a conductor and uses the remaining part as a semiconductor through a process of partially metalizing the semiconductor layer.

In addition, electrodes of a TFT described below exclusive of a gate electrode may be called a source electrode and a drain electrode or a drain electrode and a source electrode according to type. However, they will be described as a first electrode and a second electrode in order not to limit the same.

Figure 1:
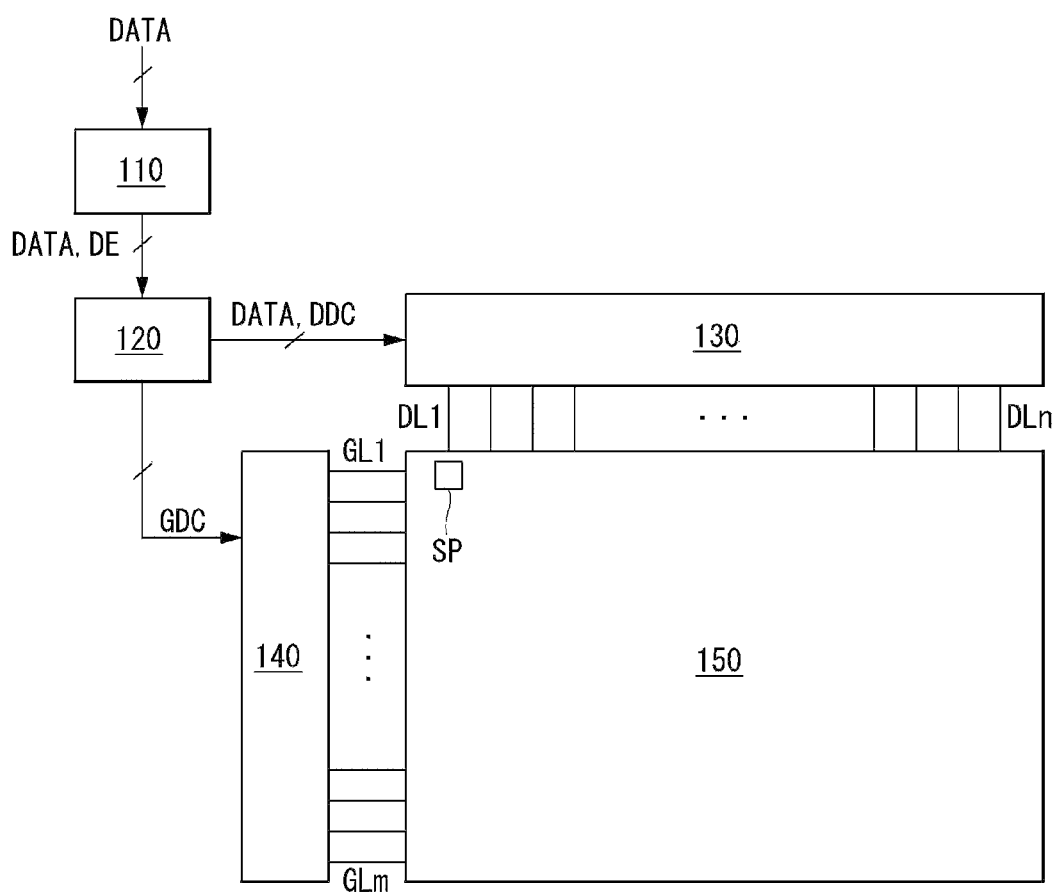
FIG. 1 is a block diagram of an OLED display device according to an embodiment of the present disclosure.
Figure 2:
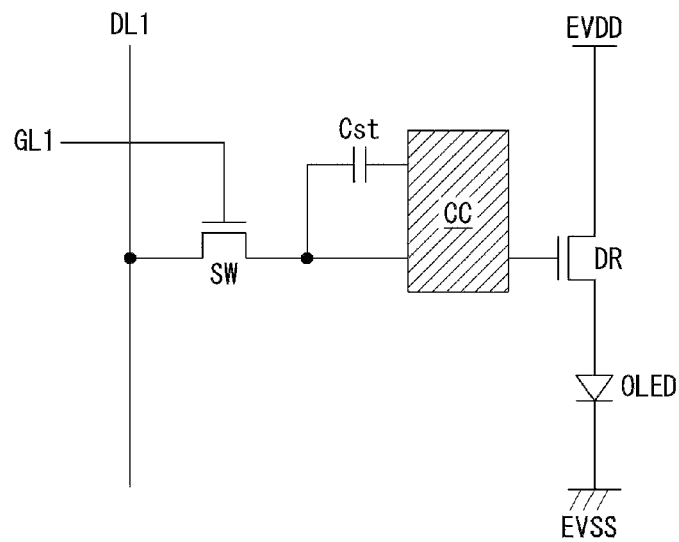
FIG. 2 illustrates a circuit configuration of a sub-pixel according to an embodiment of the present disclosure.
Figure 3:
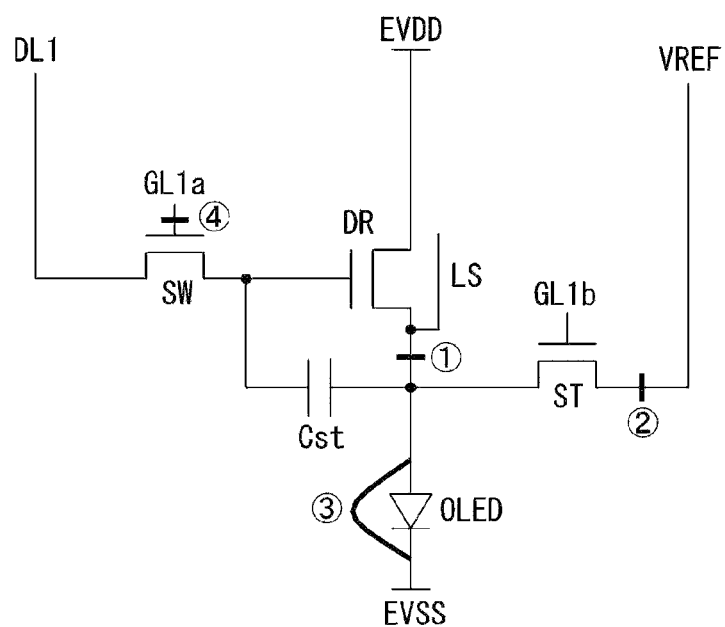
FIG. 3 illustrates a circuit configuration of a sub-pixel according to an embodiment of the present disclosure.
Figure 4:
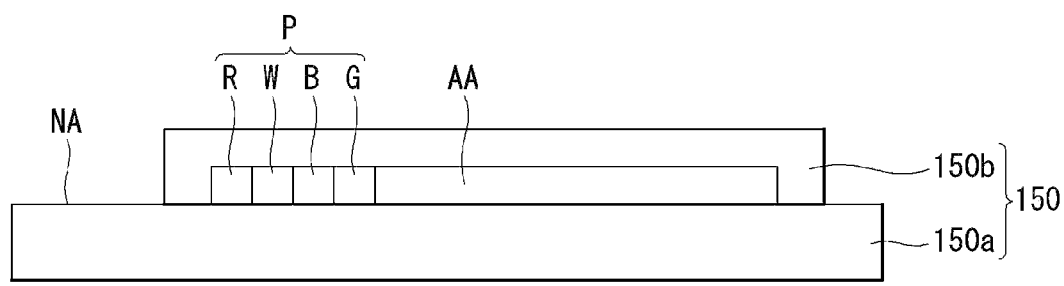
FIG. 4 is a cross-sectional view of a display panel according to an embodiment of the present disclosure.
Figure 5:
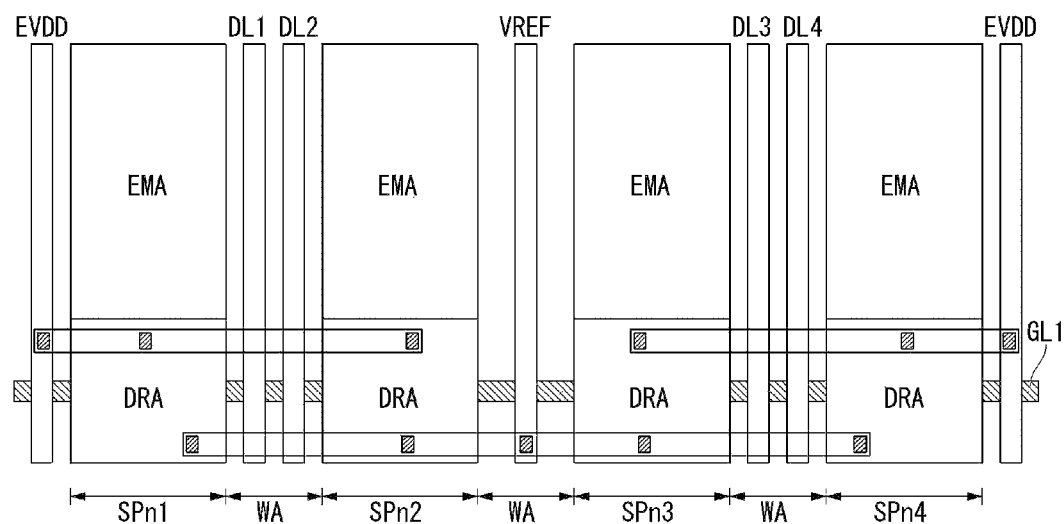
FIG. 5 is a plan view illustrating sub-pixels according to an embodiment of the present disclosure.
Figure 6:
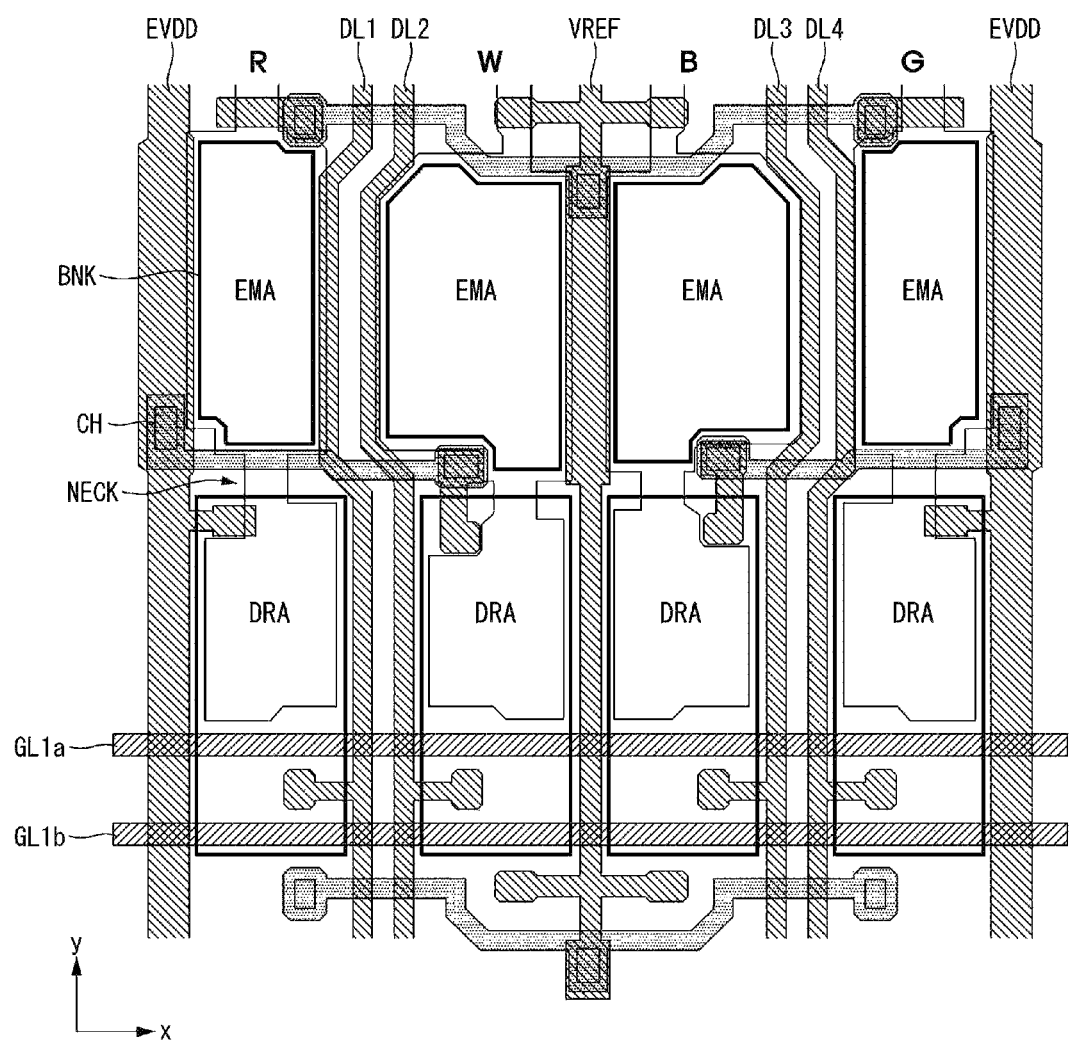
FIG. 6 is a plan view illustrating some of the sub-pixels of FIG. 5 in more detail.

FIG. 1 is a block diagram of an OLED display device according to an embodiment of the present disclosure, FIG. 2 illustrates a circuit configuration of a sub-pixel according to an embodiment of the present disclosure, and FIG. 3 illustrates a circuit configuration of a sub-pixel according to an embodiment of the present disclosure. FIG. 4 is a cross-sectional view of a display panel according to an embodiment of the present disclosure, FIG. 5 is a plan view illustrating sub-pixels according to an embodiment of the present disclosure, and FIG. 6 is a plan view illustrating some of the sub-pixels of FIG. 5 in more detail.

As shown in FIG. 1, the OLED display device according to an embodiment of the present disclosure includes an image processor 110, a timing controller 120, a data driver 130, a scan driver 140, and a display panel 150.

The image processor 110 outputs a data enable signal DE along with a data signal DATA supplied externally. While the image processor 110 can output one or more of a vertical synchronization signal, a horizontal synchronization signal, and a clock signal in addition to the data enable signal DE, these signals are not shown for convenience of description.

The timing controller 120 receives the data signal DATA in addition to the data enable signal DE or a driving signal including the vertical synchronization signal, the horizontal synchronization signal, and the clock signal from the image processor 110. The timing controller 120 outputs a gate timing control signal GDC for controlling operation timing of the scan driver 140 and a data timing control signal DDC for controlling operation timing of the data driver 130 on the basis of the driving signal.

The data driver 130 samples and latches the data signal DATA supplied from the timing controller 120 in response to the data timing control signal DDC received from the timing controller 120 to convert the data signal DATA into a gamma reference voltage and outputs the gamma reference voltage. The data driver 130 outputs the data signal DATA through data lines DL1 to DLn. The data driver 130 may take the form of an integrated circuit (IC).

The scan driver 140 outputs a scan signal in response to the gate timing control signal GDC supplied from the timing controller 120. The scan driver 140 outputs the scan signal through scan lines GL1 to GLm. The scan driver 140 takes the form of an IC or the form of a gate-in-panel in the display panel 150.

The display panel 150 displays an image in response to the data signal DATA and the scan signal supplied from the data driver 130 and the scan driver 140. The display panel 150 includes sub-pixels SP operating to display an image.

The sub-pixels SP include red, green, and blue sub-pixels or white, red, green, and blue sub-pixels. The sub-pixels SP may have one or more different emission areas according to emission characteristics.

As shown in FIG. 2, a single sub-pixel includes a switching transistor SW, a driving transistor DR, a capacitor Cst, a compensation circuit CC, and an OLED.

The switching transistor SW performs a switching operation such that a data signal supplied through the first data line DL1 is stored in the capacitor Cst as a data voltage in response to a scan signal supplied through the first scan line GL1. The driving transistor DR operates such that a driving current flows between a first power line EVDD and a second power line EVSS according to the data voltage stored in the capacitor Cst. The OLED operates to emit light according to the driving current generated by the driving transistor DR.

The compensation circuit CC is added to the sub-pixel in order to compensate for a threshold voltage of the driving transistor DR. The compensation circuit CC is composed of one or more transistors. The compensation circuit CC is configured in various manners depending on compensation methods. An example of the configuration of the compensation circuit CC will be described below.

As shown in FIG. 3, the compensation circuit CC includes a sensing transistor ST and a sensing line VREF. The sensing transistor ST is connected between the source line of the driving transistor DR and the anode of the OLED (to a sensing node). The sensing transistor ST operates to supply an initialization voltage (or sensing voltage) delivered through the sensing line VREF to the sensing node or to sense the voltage or current of the sensing node.

The switching transistor SW has a first electrode connected to the first data line DL1 and a second electrode connected to the gate electrode of the driving transistor DR. The driving transistor DR has a first electrode connected to the first power line EVDD and a second electrode connected to the anode of the OLED. The capacitor Cst has a first electrode connected to the gate electrode of the driving transistor DR and a second electrode connected to the anode of the OLED. The OLED has the anode connected to the second electrode of the driving transistor DR and a cathode connected to the second power line EVSS. The sensing transistor ST has a first electrode connected to the sensing line VREF and a second electrode connected to the anode of the OLED.

The operating time of the sensing transistor ST may be similar/identical to the operating time of the switching transistor SW according to a compensation algorithm (or the configuration of the compensation circuit). For example, the gate electrode of the switching transistor SW can be connected to a first a scan line GL1a and the gate electrode of the sensing transistor ST can be connected to a first b sensing line GL1b. Alternatively, the first a scan line GL1a connected to the gate electrode of the switching transistor SW and the first b scan line GL1b connected to the gate electrode of the sensing transistor ST may be connected to be shared.

The sensing line VREF may be connected to the data driver. In this case, the data driver can sense the sensing node of the sub-pixel in real time, for an image non-display period or for a period of N frames (N being an integer equal to or greater than 1) and generate a sensing result. Meanwhile, the switching transistor SW and the sensing transistor ST may be turned on at the same time. In this case, a sensing operation through the sensing line VREF and a data output operation for outputting a data signal are separated from each other on the basis of a time division method of the data driver.

In addition, a compensation target according to the sensing result may be a digital data signal, an analog data signal, or a gamma signal. Furthermore, the compensation circuit which generates a compensation signal (or compensation voltage) on the basis of the sensing result may be included in the data driver or the timing controller, or implemented as a separate circuit.

A light shielding layer LS may be formed only under the channel region of the driving transistor DR or formed under the channel regions of the switching transistor SW and the sensing transistor ST as well as the channel region of the driving transistor DR. The light shielding layer LS may be used to simply block external light or may be used as an electrode which is connected to other electrodes or lines and constitutes a capacitor.

Although FIG. 3 shows a sub-pixel having a 3T (Transistor) 1C (Capacitor) structure which includes the switching transistor SW, the driving transistor DR, the capacitor Cst, the OLED, and the sensing transistor ST, a sub-pixel may be configured in 3T2C, 4T2C, 5T1C, and 6T2C structures when the compensation circuit CC is added.

As shown in FIG. 4, sub-pixels are formed on a display area AA of a first substrate (or TFT substrate) 150a on the basis of the circuit described with reference to FIG. 3. The sub-pixels formed on the display area AA are sealed by a passivation film (or passivation substrate) 150b. NA indicates a non-display area. The first substrate 150a can be formed of glass or a ductile material.

The sub-pixels are horizontally or vertically arranged in the order of red (R), white (W), blue (B), and green (G) sub-pixels on the display area AA. Sub-pixels R, W, B, and G constitute a single pixel P. However, the arrangement order of the sub-pixels may be changed in various manners according to emission materials, emission areas, compensation circuit configurations (structures), etc. Furthermore, sub-pixels R, B, and G may constitute a single pixel P.

As shown in FIGS. 4 and 5, first to fourth sub-pixels SPn1 to SPn4 each having an emission area EMA and a circuit area DRA are formed on the display area AA of the first substrate 150a. An OLED is formed in the emission area EMA and TFTs including switching and driving transistors are formed in the circuit area DRA.

The elements formed in the emission area EMA and the circuit area DRA are obtained through processes of depositing a plurality of conductive layers, metal layers, and insulating layers. The emission area EMA can be defined as an area from which light generated from the OLED is emitted and the circuit area DRA can be defined as an area from which light is not emitted.

In the first to fourth sub-pixels SPn1 to SPn4, the OLED positioned in the emission area EMA emits light in response to operations of the switching and driving transistors positioned in the circuit area DRA. "WA" between neighboring sub-pixels of the first to fourth sub-pixels SPn1 to SPn4 indicates a line area in which reference lines, power lines, or data lines are arranged.

The first power line EVDD may be positioned to the left of the first sub-pixel SPn1, the sensing line VREF may be positioned to the right of the second sub-pixel SPn2, and the first and second data lines DL1 and DL2 may be positioned between the first sub-pixel SPn1 and the second sub-pixel SPn2.

The sensing line VREF may be positioned to the left of the third sub-pixel SPn3, the first power line EVDD may be positioned to the right of the fourth sub-pixel SPn4, and the third and fourth data lines DL3 and DL4 may be positioned between the third sub-pixel SPn3 and the fourth sub-pixel SPn4.

The first sub-pixel SPn1 can be electrically connected to the first power line EVDD located to the left thereof, the first data line DL1 located to the right thereof, and the sensing line VREF located to the right of the second sub-pixel SPn2. The second sub-pixel SPn2 can be electrically connected to the second data line DL2 located to the left thereof, the sensing line VREF located to the right thereof, and the first power line EVDD located to the left of the first sub-pixel SPn1.

The third sub-pixel SPn3 can be electrically connected to the sensing line VREF located to the left thereof, the third data line DL3 located to the right thereof, and the first power line EVDD located to the right of the fourth sub-pixel SPn4. The fourth sub-pixel SPn4 can be electrically connected to the fourth data line DL4 located to the left thereof, the first power line EVDD located to the right thereof, and the sensing line VREF located to the left of the third sub-pixel SPn3.

Although the first to fourth sub-pixels SPn1 to SPn4 may be commonly connected to the sensing line VREF positioned between the second sub-pixel SPn2 and the third sub-pixel SPn3, the present disclosure is not limited thereto. In addition, although only one scan line GL1 is shown, the present disclosure is not limited thereto.

In addition, although lines such as the first power line EVDD and the sensing line VREF and electrodes constituting the TFTs are located on different layers, they are electrically connected through contact holes (via holes). A contact hole is formed through a dry or wet etching process to expose part of a structure including an electrode, a signal line, or a power line positioned therebeneath.

Meanwhile, a display panel is realized with a large screen and high definition. Accordingly, the number of conductive layers, metal layers, and insulating layers formed on a substrate constituting the display panel increases. Furthermore, increase in the complexity of a layout for substrate design and peeling of a specific layer due to particles increase the possibility of short-circuit generation between metal layers (or between a conductive layer and a metal layer) positioned at different levels.

To solve such problems, a repair process of removing defects in structures formed on a substrate or blackening defective sub-pixels is used.

As shown in FIGS. 5 and 6, the first sub-pixel SPn1 can be defined as a red sub-pixel R, the second sub-pixel SPn2 can be defined as a white sub-pixel W, the third sub-pixel SPn3 can be defined as a blue sub-pixel B, and the fourth sub-pixel SPn4 can be defined as a green sub-pixel G.

A neck is present between the circuit area DRA and the emission area EMA of each of the red, white, blue, and green sub-pixels R, W, B, and G. The neck can be defined as a lower electrode through which a driving current generated from the circuit area DRA is delivered to the OLED of the emission area EMA. Although the lower electrode of the OLED can be selected as the anode or cathode, an example in which the lower electrode is selected as the anode will be described below.

The anode may short-circuit with the cathode located thereabove due to particles generated during a deposition process or peeling of a neighboring layer. A sub-pixel in which a short-circuit occurs between the anode and cathode cannot be normally used. Accordingly, the sub-pixel is blackened through a repair process.

However, a conventional repair method for blackening needs to be enhanced in order to improve display panel production yield and increase process tact time while reducing manufacturing costs.

A description will be given of a repair process according to an experimental example for improving upon the conventional technique and embodiments for improving the repair method according to the experimental example. However, the present disclosure is not limited to the experimental example and the embodiments described blow.

Experimental Example

FIGS. 7 to 11 are diagrams for describing a sub-pixel structure and a repair process according to an experimental example.

Figure 7:
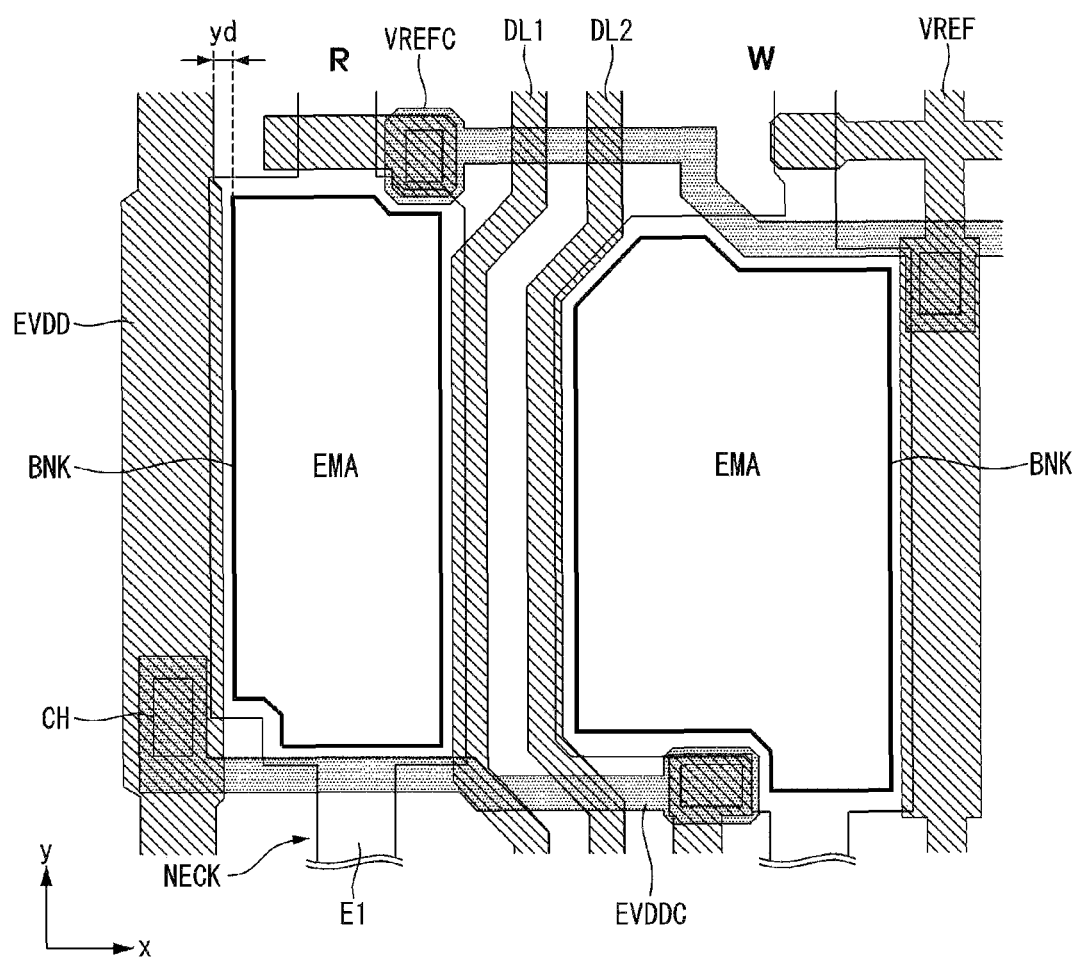
FIGS. 7 to 11 are diagrams for describing a sub-pixel structure and a repair process according to an experimental example.

As shown in FIG. 7, an anode E1 is positioned in the circuit area DRA and the emission area EMA of a sub-pixel. The anode E1 has a neck positioned between the circuit area DRA and the emission area EMA. The neck has a narrower width than the circuit area DRA and the emission area EMA.

Figure 8:
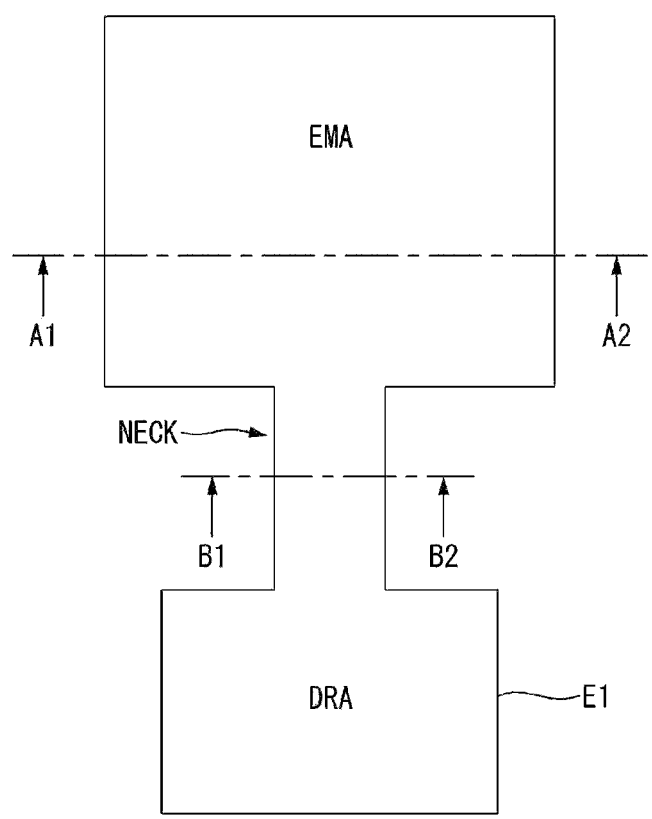
Figure 9:
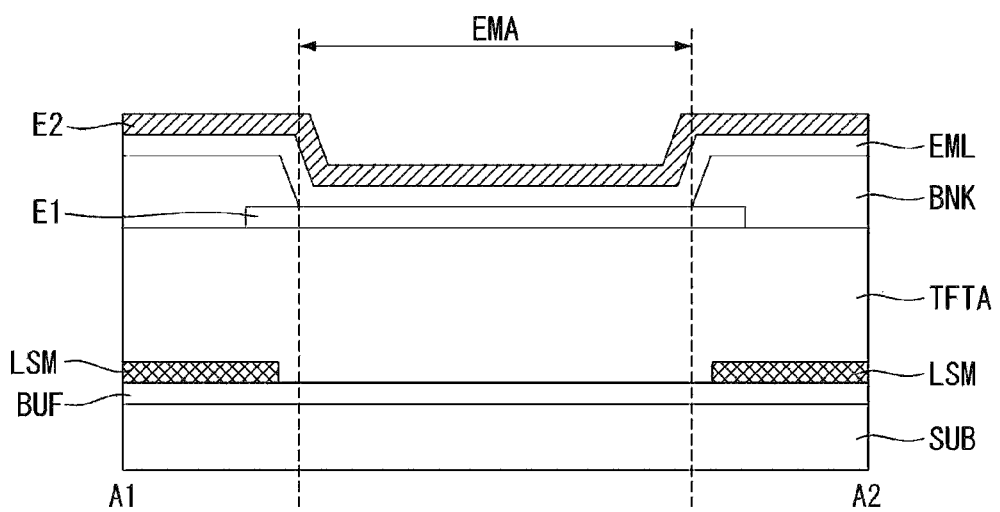

FIG. 9 shows an example cross-section across region A1-A2 in FIG. 8. As shown in FIGS. 8 and 9, a buffer layer BUF is formed on a substrate SUB. A light shielding layer LSM is formed on the buffer layer BUF. The light shielding layer LSM is patterned not to obstruct emission of light generated from the emission area EMA. The light shielding layer LSM is formed not to overlap with the emission area EMA in the vertical direction. The light shielding layer LSM is used as a connection electrode of the first power line EVDD passing the corresponding region as represented by EVDDC of FIG. 7.

A TFT part TFTA composed of a structure including a semiconductor layer, a gate metal layer, and a source and drain metal layer is formed on the light shielding layer LSM. The TFT part TFTA includes one or more TFTs and capacitors. Although the TFTs and capacitors may have various structures according to materials and manufacturing methods, they are simply shown in the figure.

An OLED composed of an anode E1, an emission layer EML, and a cathode E2 is formed on the TFT part TFTA. The emission area EMA which defines the area from which light generated from the OLED E1, EML, and E2 is emitted is defined by a bank layer BNK formed on the anode E1.

Figure 10:
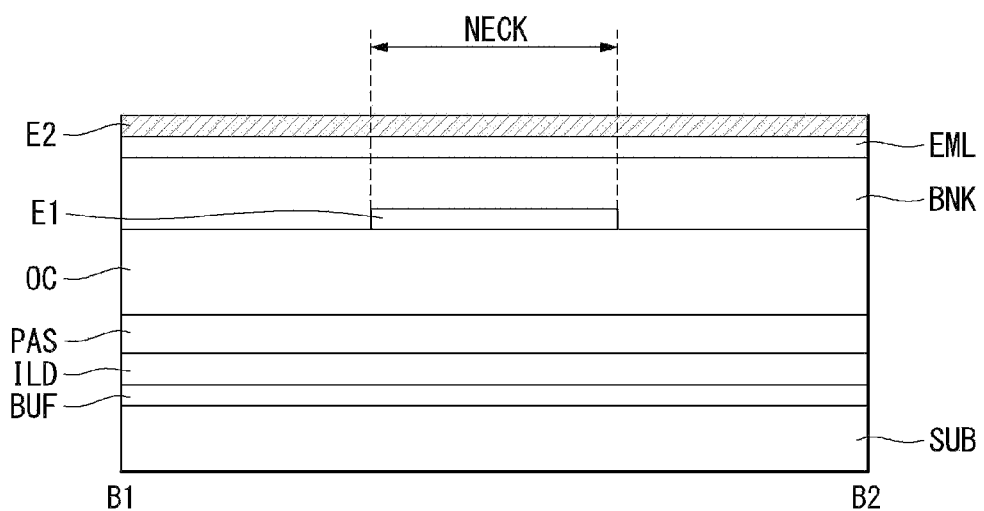
Figure 11:
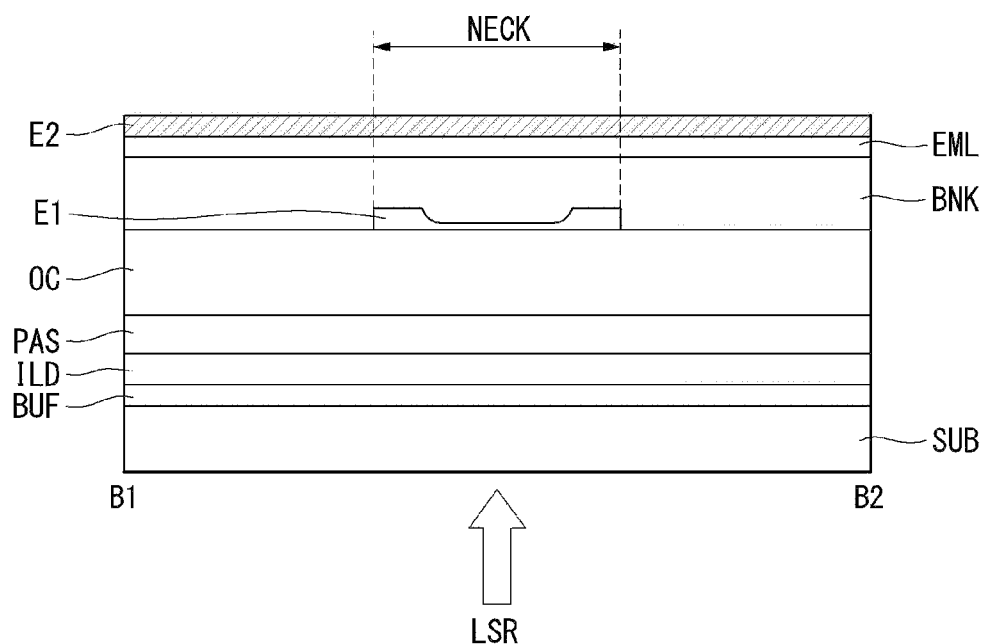

FIG. 10 shows an example cross-section across region B1-B2 in FIG. 8. As shown in FIGS. 8 and 10, the buffer layer BUF is formed on the substrate SUB. An interlayer insulating layer ILD is formed on the buffer layer BUF. A passivation layer PAS is formed on the interlayer insulating layer ILD. A planarization layer OC (or overcoat layer) made of an insulating material for flattening the surface is formed on the passivation layer PAS. The anode E1 having the neck is formed on the planarization layer OC. The bank layer BNK is formed on the anode E1. Meanwhile, the structure of the insulating layers positioned corresponding to the neck is not limited to the structure shown in FIG. 10.

As shown in FIGS. 7 to 11, the sub-pixel according to the experimental example has a neck in the anode E1. Accordingly, when a specific sub-pixel of the display panel needs to be blackened, a repair process of cutting the neck of the anode E1 by radiating a laser LSR through the bottom face (the other face) of the substrate SUB to electrically separate the circuit area DRA from the emission area EMA can be performed.

In the experimental example, the repair process for blackening is performed in the following order. The repair process will be described with reference to FIG. 3.

First, the neck of the anode E1 is cut (although the cut portion of the neck may correspond to ① of FIG. 3, the present disclosure is not limited thereto).

Then, the light shielding layer serving as the connection electrode of the sensing line VREF is cut and then whether blackening has been normally performed is checked (although the cut portion of the light shielding layer may correspond to ② of FIG. 3, the present disclosure is not limited thereto).

Subsequently, when it is confirmed that blackening has been normally performed, the anode E1 and the cathode E2 are short-circuited (the short-circuit portion may correspond to ③ of FIG. 3, the present disclosure is not limited thereto).

Thereafter, the gate electrode of the switching transistor SW connected to the first a scan line GL1a is cut (although the cut portion of the gate electrode may correspond to ④ of FIG. 3, but the present disclosure is not limited thereto).

In the experimental example, the neck is formed only in the anode E1. However, the neck may be formed in any portion that requires laser cutting.

In the experimental example, the neck which requires laser cutting and thus has a narrower width than other portions is formed to facilitate the repair process.

However, there was a probability of failure of the repair process when the process of cutting the neck of the anode E1 was performed, although the structure of the experimental example was applied.

Examination of the experimental example shows that failure of the repair process is caused by a distance between the portion which is irradiated with the laser LSR and the anode E1 to be cut. When the distance between the portion which is irradiated with the laser LSR and the anode E1 is long, the anode E1 is not completely removed even after irradiation with the laser LSR and part thereof remains as a residual film.

Accordingly, although a neck having a narrower width than other portions is formed in a portion that requires laser cutting and thus the repair process can be easily performed by cutting the neck in the experimental example, there is a possibility of generation of a problem due to a residual film.

First Embodiment

FIGS. 12 to 16 are diagrams for describing a sub-pixel structure and a repair process according to a first embodiment of the present disclosure.

Figure 12:
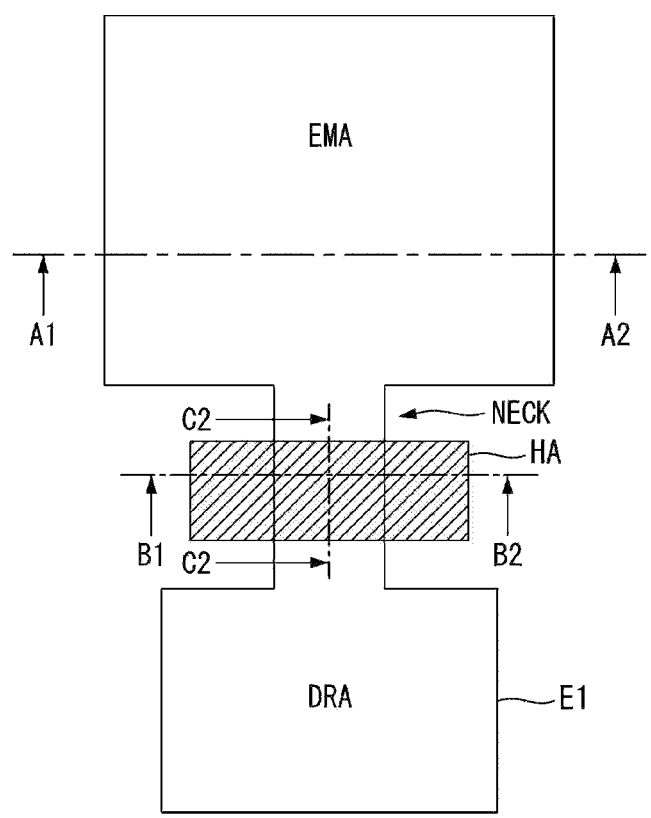
FIGS. 12 to 16 are diagrams for describing a sub-pixel structure and a repair process according to a first embodiment of the present disclosure.

As shown in FIG. 12, the anode E1 is positioned in the circuit area DRA and the emission area EMA of a sub-pixel. The anode E1 has a neck positioned between the circuit area DRA and the emission area EMA. The neck has a narrower width than the circuit area DRA and the emission area EMA.

Figure 13:
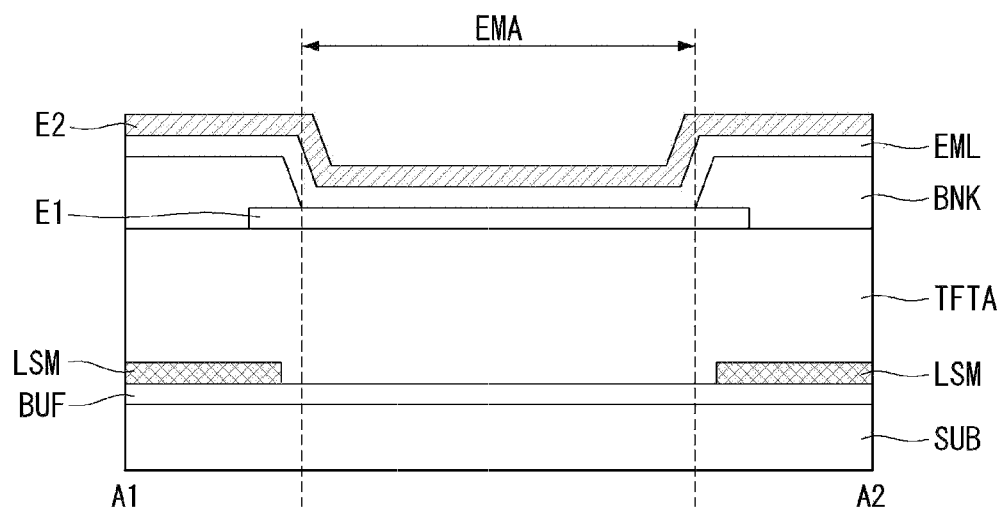

FIG. 13 shows an example cross-section across region A1-A2 in FIG. 12. As shown in FIGS. 12 and 13, a buffer layer BUF is formed on a substrate SUB. A light shielding layer LSM is formed on the buffer layer BUF. The light shielding layer LSM is patterned not to obstruct emission of light generated from the emission area EMA. The light shielding layer LSM is formed not to overlap with the emission area EMA in the vertical direction. The light shielding layer LSM is used as a connection electrode of the first power line EVDD passing the corresponding region as represented by EVDDC of FIG. 7.

A TFT part TFTA composed of a structure including a semiconductor layer, a gate metal layer, and a source and drain metal layer is formed on the light shielding layer LSM. The TFT part TFTA includes one or more TFTs and capacitors. Although the TFTs and capacitors may have various structures according to materials and manufacturing methods, they are simply shown in the figure.

An OLED composed of an anode E1, an emission layer EML and a cathode E2 is formed on the TFT part TFTA. The emission area EMA which defines the area from which light generated from the OLED E1, EML and E2 is emitted is defined by a bank layer BNK formed on the anode E1.

Figure 14:
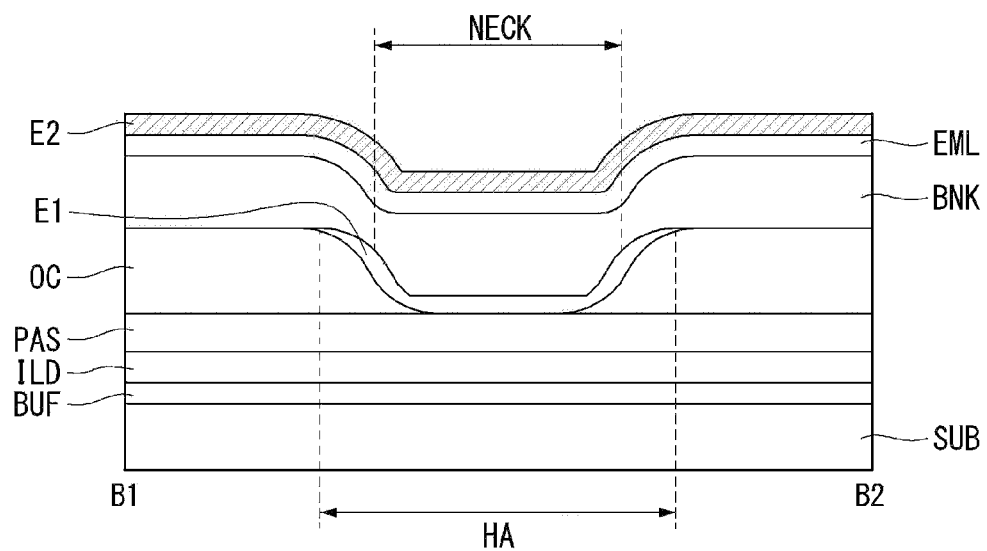
Figure 15:
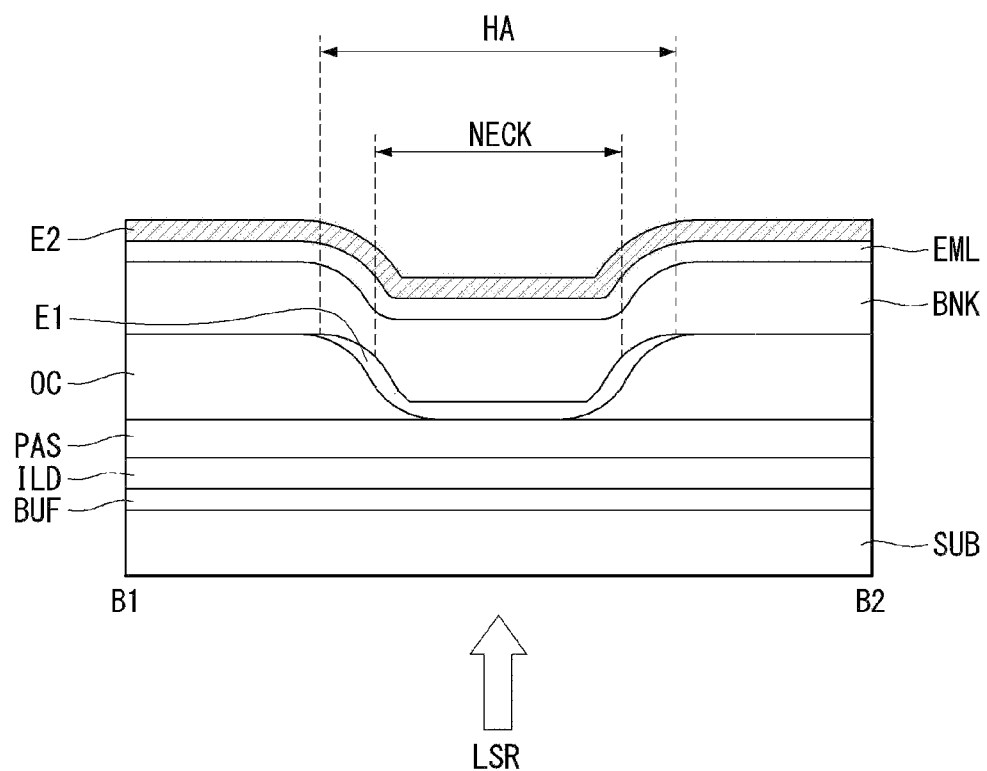

FIG. 14 shows an example cross-section across region B1-B2 in FIG. 12. As shown in FIGS. 12 and 14, the buffer layer BUF is formed on the substrate SUB. An interlayer insulating layer ILD is formed on the buffer layer BUF. A passivation layer PAS is formed on the interlayer insulating layer ILD. A planarization layer OC (or overcoat layer) made of an insulating material for flattening the surface is formed on the passivation layer PAS. The anode E1 having the neck is formed on the planarization layer OC. The bank layer BNK is formed on the anode E1. Meanwhile, the structure of the insulating layers positioned corresponding to the neck is not limited to the structure shown in FIG. 14.

In the first embodiment, a recessed pattern HA is formed in the planarization layer OC positioned on the passivation layer PAS. The planarization layer OC may be patterned to expose the surface of the passivation layer PAS or approximately completely removed to form the recessed pattern HA. Here, the repair process which will be performed later can be performed more easily when the planarization layer OC is patterned to expose the surface of the passivation layer PAS.

The planarization layer OC positioned on the passivation layer PAS is formed of an organic insulating material. The recessed pattern HA may be formed in the planarization layer OC through a method of depressing the portion of the planarization layer OC which corresponds to the recessed pattern HA using a halftone mask. However, the method of forming the recessed pattern HA in the planarization layer OC is not limited thereto.

The recessed pattern HA is positioned corresponding to the neck as shown in FIGS. 13 and 14. As shown in FIG. 12, the neck is elongated in the vertical direction and the recessed pattern HA is elongated in the horizontal direction. The horizontal length of the recessed pattern HA is greater than the vertical length. The recessed pattern HA has a greater width than the neck. That is, the recessed pattern HA may have a rectangular shape having a horizontal side longer than a vertical side.

Figure 16:
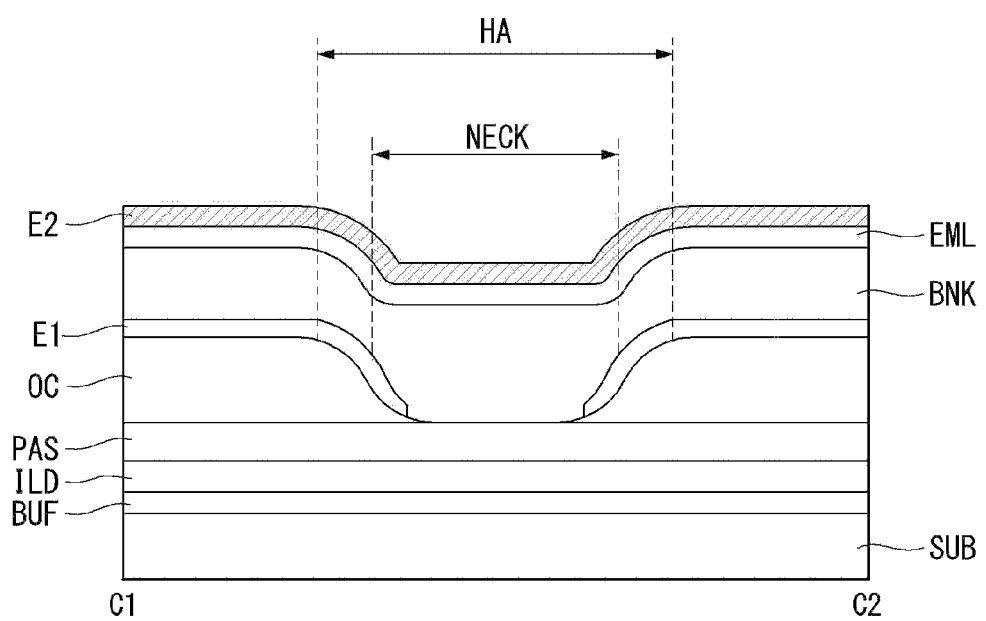

FIG. 16 shows an example cross-section across region C1-C2 in FIG. 12. As shown in FIGS. 8 to 16, the sub-pixel according to the first embodiment has a neck in the anode E1. Accordingly, when a specific sub-pixel of the display panel needs to be blackened, a repair process of cutting the neck of the anode E1 by radiating a laser LSR through the bottom face (the other face) of the substrate SUB to electrically separate the circuit area DRA from the emission area EMA can be performed.

In the first embodiment, the repair process for blackening is performed in the following order as in the experimental example. The repair process will be described with reference to FIG. 3.

First, the neck of the anode E1 is cut (although the cut portion of the neck may correspond to ① of FIG. 3, the present disclosure is not limited thereto).

Then, the light shielding layer serving as the connection electrode of the sensing line VREF is cut and then whether blackening has been normally performed is checked (although the cut portion of the light shielding layer may correspond to ② of FIG. 3, the present disclosure is not limited thereto).

Subsequently, when it is confirmed that blackening has been normally performed, the anode E1 and the cathode E2 are short-circuited (although the short-circuit portion may correspond to ③ of FIG. 3, the present disclosure is not limited thereto).

Thereafter, the gate electrode of the switching transistor SW connected to the first a scan line GL1a is cut (although the cut portion of the gate electrode may correspond to ④ of FIG. 3, the present disclosure is not limited thereto).

In the first embodiment, the neck and the recessed pattern HA are formed only in the anode E1. However, the neck and the recessed pattern HA may be formed in any portion that requires laser cutting.

As can be known from FIG. 16, the portion of the anode E1 which corresponds to the neck is positioned lower than other electrodes due to the recessed pattern HA. That is, the neck of the anode E1 is formed in a depressed region corresponding to the recessed pattern HA. In addition, the emission layer EML and the cathode E2 as well as the anode E1 have depressed portions corresponding to the recessed pattern HA, compared to other regions.

According to the first embodiment, the repair process can be performed more easily by forming the neck having a narrower width than other regions in a portion which requires laser cutting and forming the recessed pattern HA for depressing the neck such that the neck becomes closer to the substrate SUB.

In the structure according to the first embodiment, the neck of the anode E1 is cut without leaving a residual film of the anode E1 when the process of cutting the neck of the anode E1 is performed, and thus there is little chance of failure of the repair process.

Remarkable decrease in the probability of failure of the repair process according to the first embodiment was obtained by continuously performing research into solving the problems in the experimental example.

As described in the experimental result, failure of the repair process is caused by a distance between the portion which is irradiated with the laser LSR and the anode E1 to be cut. When the distance between the portion which is irradiated with the laser LSR and the anode E1 is long, the anode E1 is not completely removed even after irradiation with the laser LSR and part thereof remains as a residual film. To solve this problem, the power of the laser LSR is increased, or irradiation time is increased in the experimental example. In this case, however, a result of melting the anode E1 and structures disposed on and around the anode E1 occurs.

However, when the recessed pattern HA is formed in the neck as in the first embodiment, the distance between the portion to which the laser LSR is irradiated and the anode E1 can be reduced. When the repair process was performed under the same laser irradiation condition in the experimental example and the first embodiment, a residual film of the anode E1 remained in the experimental example, whereas the neck is separated without leaving a residual film of the anode E1 in the first embodiment, as shown in FIG. 16.

Consequently, the first embodiment can increase the probability of success of the repair process, compared to the experimental example, because little residual film remains from the neck of the anode E1.

Meanwhile, the recessed pattern HA positioned corresponding to the neck may be modified as in the following embodiments.

Second Embodiment

Figure 17:
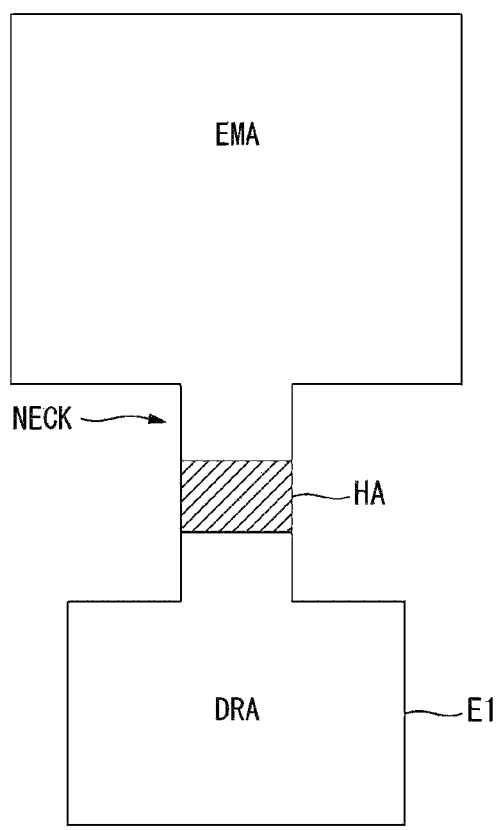
FIG. 17 is a plan view illustrating a recessed pattern applied to a repair process according to a second embodiment of the present disclosure.
Figure 18:
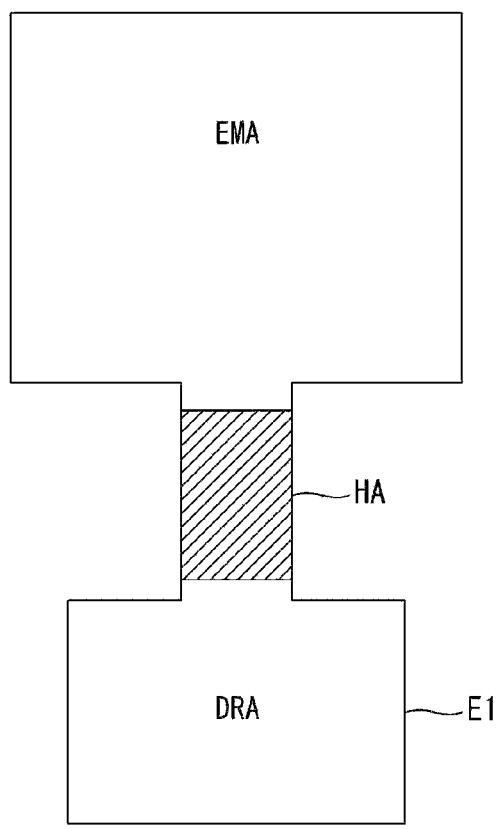
FIG. 18 is a plan view illustrating a recessed pattern applied to a repair process according to a third embodiment of the present disclosure.

FIG. 17 is a plan view illustrating a recessed pattern applied to the repair process according to a second embodiment of the present disclosure and FIG. 18 is a plan view illustrating a recessed pattern applied to the repair process according to a third embodiment of the present disclosure.

As shown in FIG. 17, the recessed pattern HA is positioned corresponding to the neck. The neck is elongated in the vertical direction. The recessed pattern HA is arranged having a width corresponding to the horizontal length of the neck and a vertical length that is less than the vertical length of the neck in consideration of other electrodes or signal lines which may be arranged in proximity to the neck.

As shown in FIG. 18, the recessed pattern HA is positioned corresponding to the neck. The neck is elongated in the vertical direction. The recessed pattern HA is arranged having vertical and horizontal lengths corresponding to those of the neck in consideration of a design in which a depressed region is formed to correspond to a region which is irradiated with a laser.

As described above, the recessed pattern HA positioned corresponding to the neck can provide advantages in the repair process for blackening. However, when the recessed pattern HA occupies an excessively wide or long area, surface evenness and uniformity of the electrode may be deteriorated. Accordingly, it is desirable to design the recessed pattern HA in consideration of this fact. In addition, the recessed pattern HA may have various shapes such as a rectangle, a square, a circle, an oval and the like corresponding to positional restrictions or shape of the neck.

As described above, the present invention can improve a display panel production yield and a process tact time while reducing manufacturing costs during the repair process for blackening. Furthermore, the present invention can suppress generation of a residual film during the repair process for blackening to improve the repair success rate and secure device reliability.

What is claimed is:

1. A display device comprising:
    a substrate having an emission area and a circuit area separated from the emission area;
    an insulating layer positioned on a substrate, wherein at least a part of the insulating layer steps downward toward the substrate to form a recessed pattern in the insulating layer; and
    an electrode extending along a first direction on the insulating layer, the electrode including:
        a first portion having a first width along a second direction perpendicular to the first direction,
        a second portion having a second width along the second direction, and
        a neck positioned between the emission area and the circuit area, and in between the first portion and the second portion, wherein a width of the neck along the second direction is narrower than the first width and the second width, and wherein the neck is disposed in the recessed pattern of the insulating layer.

2. The display device according to claim 1, wherein a width of the recessed pattern along the second direction corresponds to or is greater than the width of the neck.

3. The display device according to claim 1, wherein light is emitted from the emission area and light is not emitted from the circuit area.

4. The display device according to claim 1, wherein at least a part of the electrode corresponding to the recessed pattern steps downward toward the substrate.

5. The display device according to claim 1, wherein the insulating layer is a planarization layer formed of an insulating material for flattening a surface of the display device.

6. The display device according to claim 5, further comprising a buffer layer positioned between the substrate and the planarization layer, an interlayer insulating layer positioned on the buffer layer, and a passivation layer positioned on the interlayer insulating layer.

7. The display device according to claim 6, wherein the recessed pattern is patterned to expose a surface of the passivation layer positioned under the planarization layer.

8. A method of manufacturing a display device, comprising:
    forming an insulating layer on one side of a substrate, the substrate having an emission area and a circuit area separated from the emission area;
    forming a recessed pattern in the insulating layer in which at least a part of the insulating layer steps downward toward the substrate; and
    forming an electrode extending along a first direction on the insulating layer, the electrode including:
        a first portion having a first width along a second direction perpendicular to the first direction,
        a second portion having a second width along the second direction, and
        a neck positioned between the emission area and the circuit area, and in between the first portion and the second portion, wherein a width of the neck along the second direction is narrower than the first width and the second width, and wherein the neck is disposed in the recessed pattern of the insulating layer.

9. The method according to claim 8, further comprising positioning a laser source on another side of the substrate, radiating a laser to the neck and a region at which the recessed pattern is positioned, and separating the electrode into a first electrode of the emission area from which light is emitted and a second electrode of the circuit area from which light is not emitted.

10. The method according to claim 8, wherein a width of the recessed pattern along the second direction corresponds to or is greater than the width of the neck.

11. The method according to claim 8, wherein forming the insulating layer comprises:
    forming a buffer layer on the substrate;
    forming an interlayer insulating layer on the buffer layer;
    forming a passivation layer on the interlayer insulating layer; and
    forming a planarization layer serving as the insulating layer on the passivation layer.

12. The method according to claim 11, wherein forming the recessed pattern comprises patterning the planarization layer using a halftone mask to expose a surface of the passivation layer positioned under the planarization layer.

* * * * *